(12) United States Patent
Bernardon

(10) Patent No.: US 9,689,928 B2
(45) Date of Patent: Jun. 27, 2017

(54) SYSTEM AND METHOD FOR A BUILT-IN SELF-TEST OF A BATTERY

(71) Applicant: Infineon Technologies AG, Neubiberg (DE)

(72) Inventor: Derek Bernardon, Villach (AT)

(73) Assignee: Infineon Technologies AG, Neubiberg (DE)

( * ) Notice: Subject to any disclaimer, the term of this patent is extended or adjusted under 35 U.S.C. 154(b) by 363 days.

(21) Appl. No.: 14/491,823

(22) Filed: Sep. 19, 2014

(65) Prior Publication Data
US 2016/0084914 A1    Mar. 24, 2016

(51) Int. Cl.
| H01M 10/44 | (2006.01) |
| H01M 10/46 | (2006.01) |
| G01R 31/36 | (2006.01) |
| H01M 10/0525 | (2010.01) |
| H01M 10/42 | (2006.01) |
| H01M 10/48 | (2006.01) |

(Continued)

(52) U.S. Cl.
CPC ..... *G01R 31/3662* (2013.01); *G01R 31/3624* (2013.01); *G01R 31/3655* (2013.01); *H01M 10/0525* (2013.01); *H01M 10/425* (2013.01); *H01M 10/48* (2013.01); *H01M 10/482* (2013.01); *G01R 31/3627* (2013.01); *H01M 4/485* (2013.01); *H01M 4/5825* (2013.01); *H01M 10/052* (2013.01); *H01M 2010/4278* (2013.01); *H01M 2220/20* (2013.01); *Y02E 60/122* (2013.01)

(58) Field of Classification Search
CPC .. H02J 7/0029; H02J 7/0026; G01R 31/3648; G01R 19/16542

USPC .......... 320/127, 128, 140; 307/66; 324/426, 324/427, 430, 433, 434
See application file for complete search history.

(56) References Cited

U.S. PATENT DOCUMENTS

| 4,700,974 A | 10/1987 | Andres et al. |
| 5,085,464 A | 2/1992 | Behr et al. |

(Continued)

FOREIGN PATENT DOCUMENTS

| DE | 3733399 C2 | 4/1998 |
| DE | 102004010765 A1 | 10/2005 |

(Continued)

OTHER PUBLICATIONS

Pofahl, E., "The Application of IEC 61508 in the Automotive Industry," Ford Research & Advanced Engineering, D, Summer 2005, pp. 1-6.

*Primary Examiner* — Edward Tso
(74) *Attorney, Agent, or Firm* — Slater Matsil, LLP

(57) ABSTRACT

According to an embodiment, a system includes a switching regulator and an electrochemical storage test circuit. The switching regulator is coupled to a power supply input and configured to supply a regulated voltage to a regulated supply terminal that is configured to be coupled to a device. The electrochemical storage test circuit is configured to be coupled to an electrochemical storage unit. The electrochemical storage test circuit includes a bidirectional switch with a first switch terminal coupled to the regulated supply terminal, a second switch terminal configured to be coupled to the electrochemical storage unit, and a switch control terminal. The electrochemical storage test circuit also includes a built-in self-test (BIST) circuit configured to be coupled to the electrochemical storage unit and to the switch control terminal.

26 Claims, 6 Drawing Sheets

(51) Int. Cl.
*H01M 4/485* (2010.01)
*H01M 4/58* (2010.01)
*H01M 10/052* (2010.01)

(56) References Cited

U.S. PATENT DOCUMENTS

| | | |
|---|---|---|
| 5,170,066 A | 12/1992 | Huber |
| 6,124,784 A | 9/2000 | Wells |
| 7,142,407 B2 | 11/2006 | Sibrai |
| 7,932,622 B2 | 4/2011 | Chiozzi et al. |
| 8,552,849 B2 | 10/2013 | Scherr |
| 2004/0148121 A1 | 7/2004 | de Obaldia et al. |
| 2006/0230304 A1 | 10/2006 | Sanada |
| 2013/0152721 A1 | 6/2013 | Trendov et al. |

FOREIGN PATENT DOCUMENTS

| | | |
|---|---|---|
| DE | 19528693 B4 | 7/2006 |
| EP | 2682309 A1 | 1/2014 |

SYSTEM AND METHOD FOR A BUILT-IN SELF-TEST OF A BATTERY

TECHNICAL FIELD

The present invention relates generally to electronic systems, and, in particular embodiments, to a system and method for a battery and Test Circuit.

BACKGROUND

Airbag supplemental restraint systems (SRS) have become increasingly pervasive because of their ability to protect vehicle occupants from serious injury in the event of a collision. A typical airbag system has an airbag, an inflation device, and a crash sensor that detects a sudden deceleration of the vehicle. In order to prevent accidental or unwanted airbag inflation, airbag systems generally require a high safety integrity level to prevent accidental or unwanted airbag inflation. One way to maintain a high safety integrity level is to use multiple sensors. For example, a typical side impact airbag system has a pressure sensor inside a car door, and an accelerometer located in a pillar next to the car door. If the pressure sensor measures a sudden rise in pressure at the same time the accelerometer detects an acceleration, the SRS system deploys the side impact airbag. By setting proper timing and amplitude conditions for the pressure sensor and accelerometer, the airbag is deployed in the event of a collision, but not from a vibration caused by a person closing the door, for example. Generally, the requisite sensing and triggering of the airbag system is coordinated by a microcontroller or microprocessor coupled to various elements of the SRS system.

One issue related to the safety integrity of SRS is the electrical integrity of the circuits and circuit boards that are coupled to the SRS system. This integrity is maintained, not only to the microcontroller and components of the SRS system, but also to the power supply system that provides power to the microcontroller and other elements of the SRS system.

For example, if there is a short circuit on a circuit board or other piece of electronic equipment that is associated with the SRS system, there is a possibility that the airbag may deploy under certain conditions when it should not. In another example, if power is removed from a circuit board or other piece of electronic equipment during an emergency situation, such as a collision, there is a possibility that the airbag may not deploy when it should. Thus, additional efforts are often necessary when designing electronic circuits for automotive safety applications. For example, automotive functional safety requirements may be specified in certain standards, such as ASEAL-D ISO26262.

SUMMARY

According to an embodiment, a system includes a switching regulator and an electrochemical storage test circuit. The switching regulator is coupled to a power supply input and configured to supply a regulated voltage to a regulated supply terminal that is configured to be coupled to a device. The electrochemical storage test circuit is configured to be coupled to an electrochemical storage unit. The electrochemical storage test circuit includes a bidirectional switch with a first switch terminal coupled to the regulated supply terminal, a second switch terminal configured to be coupled to the electrochemical storage unit, and a switch control terminal. The electrochemical storage test circuit also includes a built-in self-test (BIST) circuit configured to be coupled to the electrochemical storage unit and to the switch control terminal.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Description is made with respect to various embodiments in a specific context, namely safety systems and, more particularly, automotive safety systems. Some of the various embodiments described herein include airbags, airbag firing and controls circuits, backup battery supplies for airbag systems and firing and control circuits, and built-in self-test (BIST) for backup battery and airbag systems. In other embodiments, aspects may also be applied to other applications involving any type of backup system or safety system according to any fashion as known in the art.

According to an embodiment, airbag systems, sometimes referred to as airbag supplemental restraint systems (SRS), require a high level of safety during operation. Namely, the airbag system must activate during appropriate circumstances, such as during a collision, and must not activate during other circumstances, such as the closing of a door. In various situations, it is possible that the regular system battery, such as an automotive battery, may be disconnected from the airbag system. In such situations, the airbag system is without power, yet must still activate in the case of a collision, for example. Often in such situations, the squibs for firing the airbags are supplied by a backup capacitor or set of capacitors. According to various embodiments, the squibs, or other safety system components, are powered by a backup battery when the primary automotive battery is unavailable or disconnected from the airbag system. In various other embodiments, the backup battery may be used with various types of safety system to activate safety or emergency components in the case of detection of an emergency or unsafe event. In various embodiments, the backup battery is coupled to a built-in self-test (BIST) circuit in order to ensure proper operation during a collision or other emergency. The BIST circuit is configured to monitor the health of the battery and notify a person or system in the case of an error in the backup battery system.

Figure 1:
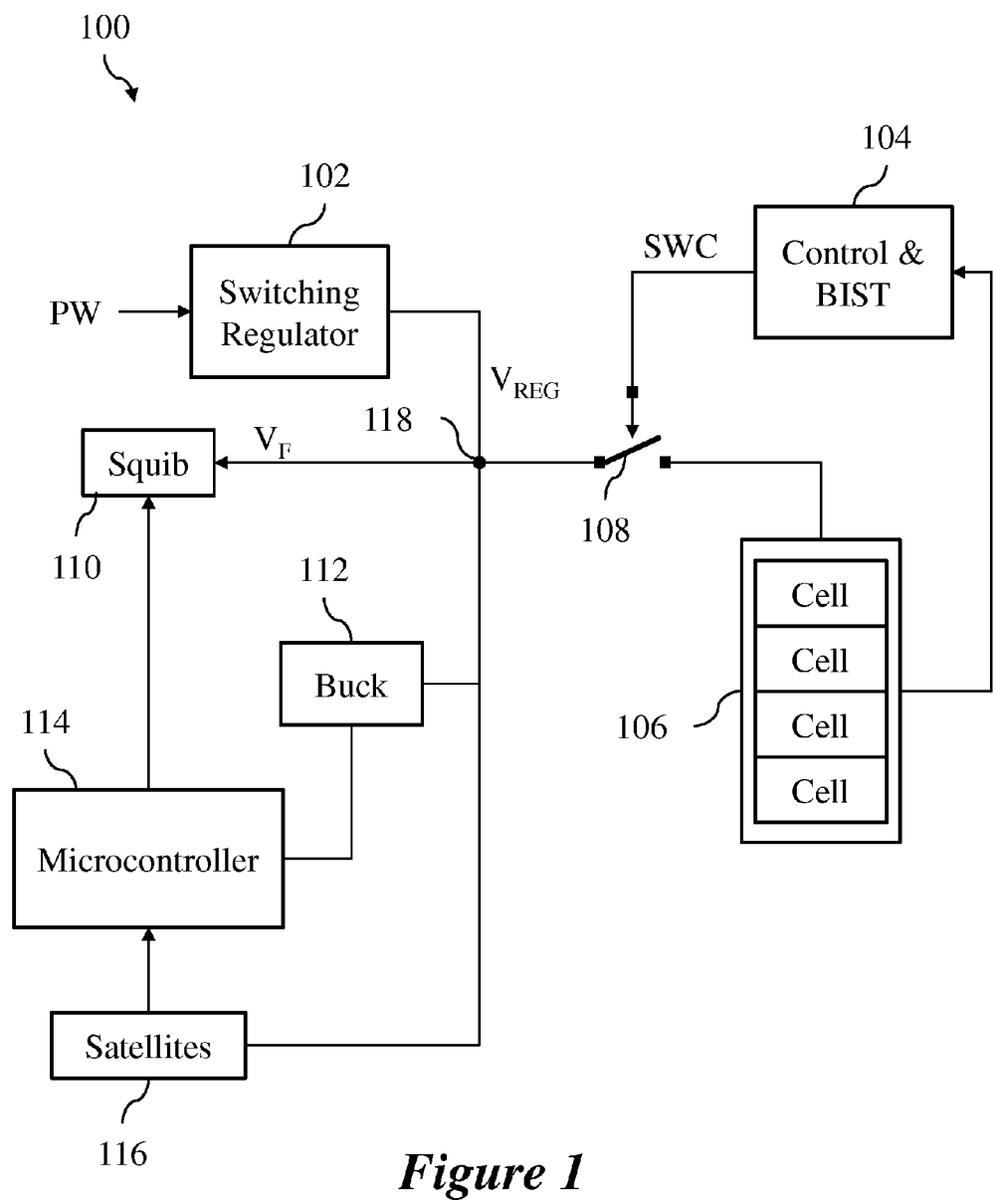
FIG. 1 illustrates a system block diagram of an embodiment emergency backup battery system.

FIG. 1 illustrates a system block diagram of an embodiment emergency backup battery system 100 including switching regulator 102, control and BIST circuit 104, backup battery 106, switch 108, squib 110, buck converter 112, microcontroller 114, and satellites 116. According to various embodiments, switching regulator 102 receives power from power supply line PW and generates regulated voltage VREG at node 118. Switching regulator 102 may be implemented as a non-switching regulator in alternative embodiments. Control and BIST circuit 104 generates switching control SWC for switch 108 such that during typical, or non-emergency, operation switch 108 supplies power from switching regulator 102 to backup battery 106 and other components within battery system 100. In various embodiments, control and BIST circuit 104 also generates switching control SWC for switch 108 during an emergency operation, such as during an automotive collision, such that battery 106 supplies power to squib 110, microcontroller 114, satellites 116, and other system components, for example. Additionally, during a test operation, control and BIST 104 generates switching control SWC for switch 108 in order to perform a self-test on backup battery 106 and ensure correct operation of backup battery 106.

According to various embodiments, backup battery 106 is formed of multiple energy storage cells. In the embodiment shown, backup battery 106 is formed of four cells. In other specific embodiments, backup battery 106 is formed of three or five cells. In still other embodiments, backup battery 106 may be formed of any number of cells.

Further, according to some embodiments, backup battery 106 is formed of battery cells that have high stability and a very long lifetime. Specifically, backup battery 106 may have a lifetime of 20 years, depending on charge cycling. Further, backup battery 106 may be implemented such that the cells of the battery will not explode, such as during extreme conditions or failure conditions, for example. In one specific embodiment, backup battery 106 is formed of lithium iron phosphate ($LiFePO_4$) cells. In another specific embodiment, backup battery 106 is formed of lithium titanate ($Li_2TiO_3$) cells. In other embodiments, backup battery 106 may be implemented using other battery types or any other appropriate types of electrochemical storage cell. For example, backup battery 106 may be implemented using supercapacitors or other equivalents.

According to various embodiments, squib 110 may contain numerous squibs for firing one or multiple airbags. In other embodiments, squib 110 may be replaced by any other emergency safety devices that are powered by backup battery 106 during detected emergency events. Buck converter 112 is an optional component for regulating and down converting regulated voltage VREG in order to supply microcontroller 114. In some embodiments, microcontroller 114 is implemented as a microcontroller, field programmable gate array (FPGA), or fully or partially custom application specific integrated circuit (ASIC). In an alternative embodiment, microcontroller 114 may be implemented with other equivalent control circuits.

In various embodiments, satellites 116 include any number of sensors for detecting an emergency event, such as an automotive collision for example. In some embodiments, satellites 116 may include accelerometers, gyroscopes, pressure sensors, or other types of sensors for detecting a collision or other event. In specific embodiments, satellites 116 are implemented as microelectromechanical systems (MEMS) sensors formed according to microfabrication techniques. For example, in some embodiments, all the components of backup battery system 100 may be contained in a single airbag module or unit. The circuit components, i.e., every component except squib 110, may be attached to a same printed circuit board (PCB). In some embodiments, satellites 116 are distributed at various positions in a vehicle or structure in order to detect an emergency event, such as a collision.

According to specific embodiments related to airbag systems in an automobile application, microcontroller 114 detects a collision based on data received from satellites 116 and determines that firing one or multiple airbags (not shown, coupled to squib or squibs 110) is necessary. In such embodiments, microcontroller 114 controls squib 110 to fire and also supplies control signals to close switch 108 and connect backup battery 106 to squib 110. In various embodiments, microcontroller 114 may be coupled directly to switch 108, to another control unit, or to control and BIST 104 (connections not shown for simplicity) in order to control switch 108 to close when activating squib 110. Further description of system components, operation, and the BIST is provided below in reference to the other figures.

Figure 2:
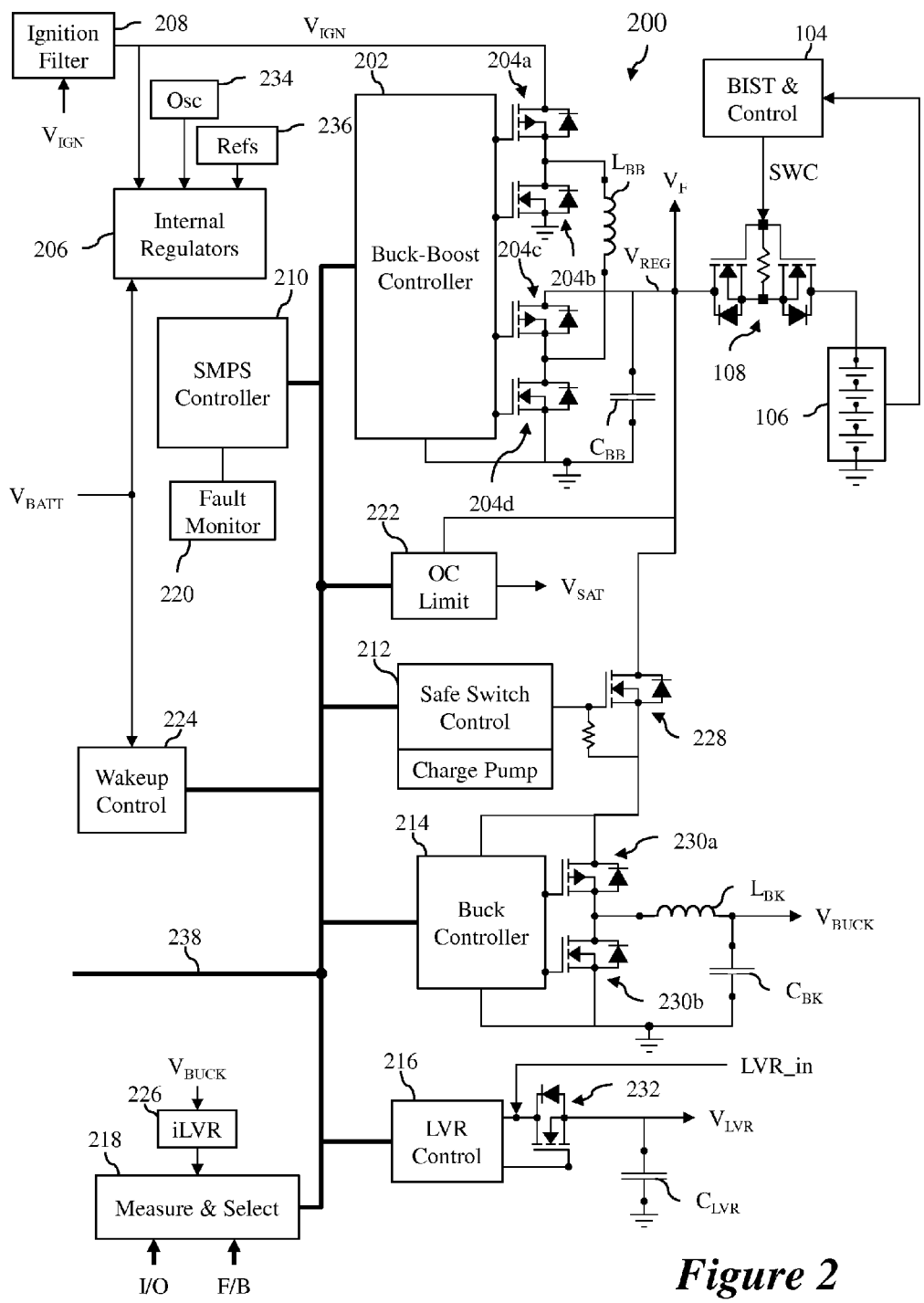
FIG. 2 illustrates a schematic of an embodiment airbag system.

FIG. 2 illustrates a schematic of an embodiment airbag system 200 including buck-boost controller 202, safe switch control circuit 212, buck controller 214, low voltage regulator (LVR) control circuit 216, and voltage measurement and channel select circuit 218, among other components. According to various embodiments, buck-boost controller 202 controls switches 204a, 204b, 204c, and 204d in order to convert and regulate supply voltage VIGN and generate regulated voltage VREG therefrom. Buck-boost controller 202 receives control information from switched mode power supply (SMPS) controller 210, which is also regulated by fault monitor 220. Regulated voltage VREG is supplied to switch 108, to overcurrent limit circuit 222, to buck controller 214 through logic safety switch 228, and as firing voltage VF to a squib or squibs (not shown). BIST and control circuit 104 controls switch 108 with switch control signal SWC and also tests backup battery 106, as described further hereinabove in reference to FIG. 1 and herein below in reference to FIGS. 3-6.

In various embodiments, buck controller 214 generates buck voltage VBUCK from regulated voltage VREG by controlled switching of switches 230a and 230b, which are coupled to buck inductor LBK and buck capacitor CBK. Buck voltage VBUCK is a regulated voltage lower than regulated voltage VREG. In some embodiments, buck voltage VBUCK is supplied to various system components, such as microcontroller 114, as shown in FIG. 1. Additionally, buck voltage VBUCK is supplied to voltage measurement and channel select circuit 218 through internal LVR (iLVR) 226. In an embodiment, iLVR 226 is integrated on a same semiconductor die with airbag system 200 and supplies a regulated voltage to internal digital components. Voltage measurement and channel select circuit 218 monitors input, output, and feedback signals throughout airbag system 200 and supplies channel selection information and measurement data on serial peripheral interface (SPI) 238. In various embodiments, SPI 238 is also coupled to wakeup control circuit 224, SMPS controller 210, buck-boost controller 202, overcurrent limit 222, logic safety control circuit 212, buck controller 214, and LVR control circuit 216 in order to provide control status information between system components.

According to various embodiments, airbag system 200 is illustrated without various feedback signals and control signals in order to present the primary components and connections. In such embodiments, in addition to the illustrated signals, any control or regulation circuit may include additional control connections and inputs as well as some type of feedback connection coupled to an output node.

In various embodiments, internal regulators 206 receives input supply voltage VIGN from ignition filter 208, an oscillator signal from oscillator 234, reference voltages from references circuit 236, and main battery voltage VBATT from a main battery coupling. Internal regulators 206 supply all internal supplies needed to bias different analog and digital domains used for startup and for operation.

According to some embodiments, switches 204a-d are switched to charge and discharge buck-boost inductor LBB and buck-boost capacitor CBB in order to either buck or boost input supply voltage VIGN and generate regulated voltage VREG. In some embodiments, regulated voltage VREG may be set to a storage voltage for backup battery 106 in order to increase the lifespan of the battery. In particular embodiments, regulated voltage VREG may be between 10V and 15V. In other embodiments, regulated voltage VREG may be other voltages. In some embodiments, switch 108, which may be referred to as a bidirectional switch, is controlled to maintain regulated voltage VREG on backup battery 106 during normal, non-emergency, operation as described hereinabove in reference to FIG. 1.

According to some embodiments, regulated voltage VREG is also supplied as satellite voltage VSAT to satellite sensors (not shown), such as satellites 116 in FIG. 1. Regulated voltage VREG is supplied as satellite voltage VSAT through overcurrent limit circuit 222, which monitors the supplied current and disconnects the satellites if an overcurrent is detected. Similarly, some embodiments include logic safety control circuit 212 and logic safety switch 228 for protecting buck controller 214 and limiting buck voltage VBUCK. In such embodiments, logic safety control circuit 212 switches logic safety switch 228 if a voltage error condition is detected. Logic safety control circuit 212 may include a charge pump for providing a boosted drive voltage in order to drive logic safety switch 228 into an on state. In some embodiments, logic safety switch 228 is implemented with an external DMOS transistor.

According to various embodiments, wakeup control circuit 224 may receive a wakeup signal (not shown) or detect a wakeup condition and provide a startup control sequence to the components in airbag system 200, such as SMPS controller 210, buck-boost controller 202, and buck controller 214, for example.

In some embodiments, LVR control circuit 216 receives an input voltage LVR_in, which may be coupled to or dependent on regulated voltage VREG or buck voltage VBUCK, and controls switch 232 based on input voltage LVR_in. Thus, LVR control circuit 216 and switch 232 together supply LVR voltage VLVR, while LVR capacitor CLVR filters LVR voltage VLVR.

Figure 3:
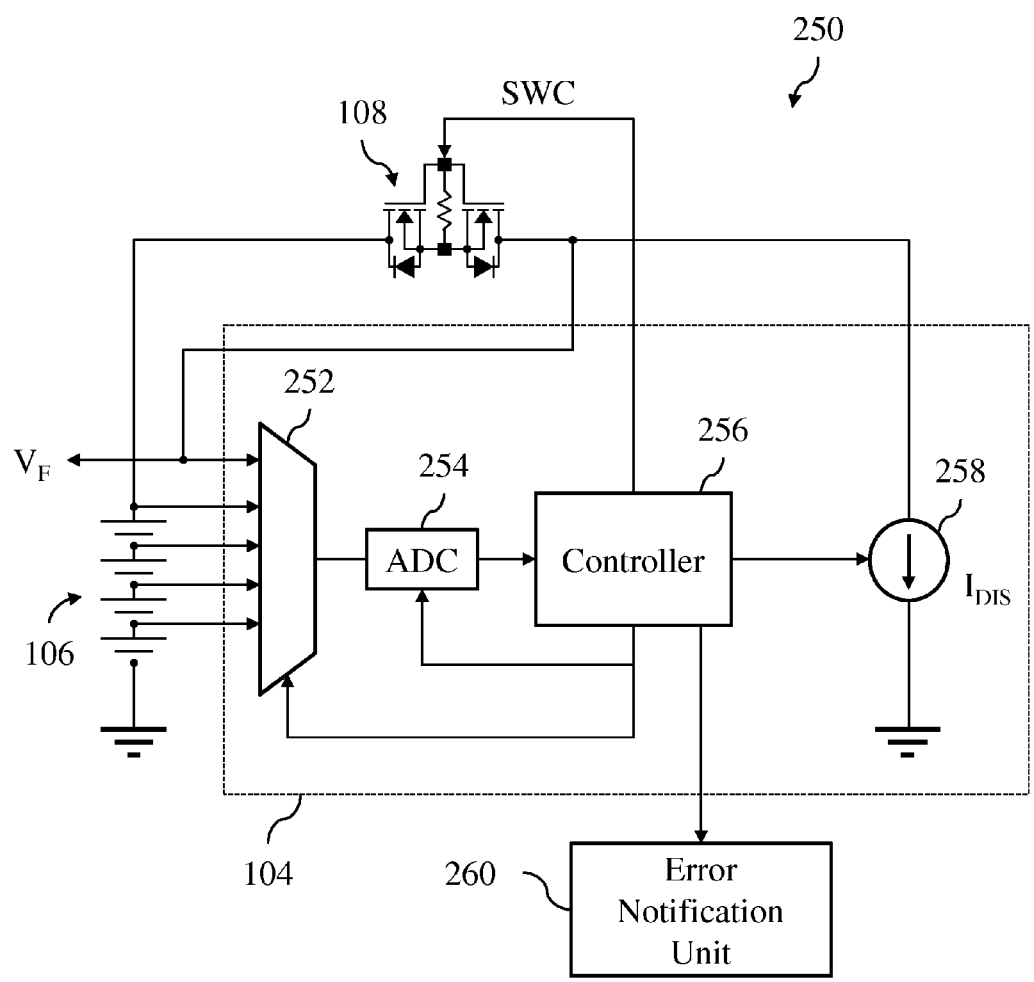
FIG. 3 illustrates a schematic of an embodiment backup battery built-in self-test (BIST)

FIG. 3 illustrates a schematic of an embodiment backup battery built-in self-test (BIST) arrangement 250 including backup battery 106, bidirectional switch 108, and BIST circuit 104, which further includes multiplexer 252, analog to digital converter (ADC) 254, controller 256, and controllable current source 258. According to various embodiments, BIST circuit 104 is configured to perform a self-test (BIST) on backup battery 106 in order to ensure that the battery is operating correctly. Specific embodiment tests are described in relation to FIGS. 4 and 5 herein below.

In various embodiments, multiplexer 252 is controlled by controller 256 to select different voltage nodes of the battery or the input firing voltage VF. In some embodiments, firing voltage VF may be the voltage used to activate the squib or squibs for firing an airbag or airbags, as an example. As described above in reference to FIGS. 1 and 2, firing voltage VF may be equal to regulated voltage VREG. ADC 254 receives the selected voltage and converts the analog signal to a digital value that is received at controller 256, which determines if backup battery 106 and firing voltage VF are within normal operation limits. For example, in some embodiments, the internal resistance of backup battery 106 and the voltage on each battery cell is determined within controller 256 during a self-test. In various embodiments, controller 256 generates control signals for controllable current switch 258, which sinks discharge current IDIS, and also for bidirectional switch 108. During a self-test, controllable current switch 258 and bidirectional switch 108 may be controlled according to the specific embodiment test implemented, as described below in reference to FIGS. 4 and 5.

In an embodiment, controller 256 within BIST circuit 104 is coupled to error notification unit 260, which manages errors and notifies the user or operator in case of an error detected during a self-test by BIST circuit 104. Controller 256 may be implemented as custom digital logic, such as with an FPGA or ASIC. In alternative embodiments, controller 256 may be implemented with a microcontroller. In such embodiments, multiplexer 252 and ADC 254 may be included within the microcontroller.

Figure 4:
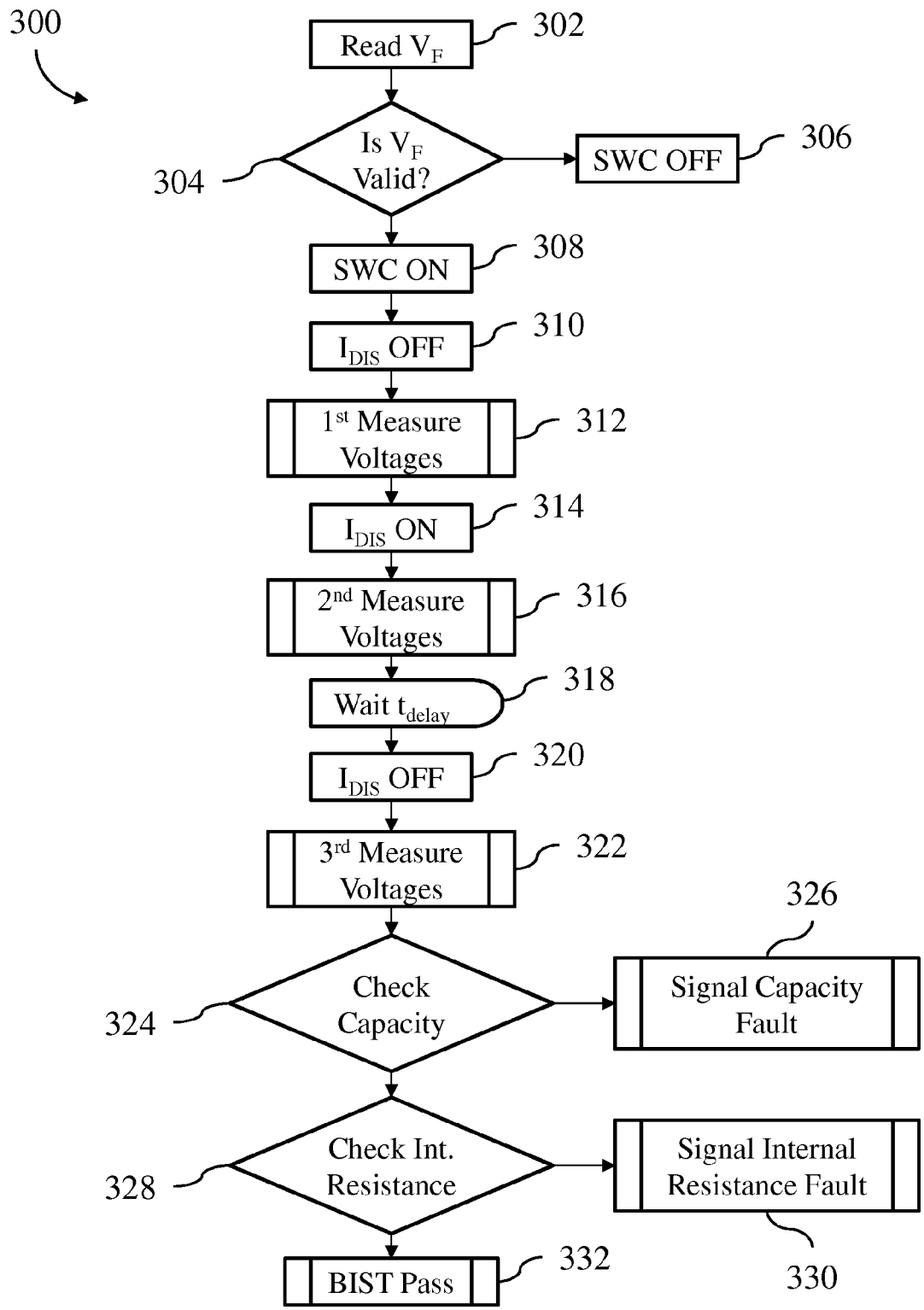
FIG. 4 illustrates a flowchart diagram of an embodiment BIST method.

FIG. 4 illustrates a flowchart diagram of an embodiment BIST method 300 including blocks 302-332, which may be implemented by BIST arrangement 250. According to an embodiment, block 302 includes reading or measuring firing voltage VF. Based on the measuring in block 302, block 304 checks if firing voltage VF is valid by determining if firing voltage VF is within a designed threshold range. For example, the target firing voltage may be 10V and the threshold range may be +/−2V leading to a threshold range of 8-12V. Some embodiments may include larger or smaller threshold ranges and may be centered at other target firing voltages. If firing voltage VF is within the threshold range, block 304 identifies firing voltage VF as valid and proceeds to block 308 to set switching control SWC to an ON level. If firing voltage VF is not within the threshold range, block 304 identifies firing voltage VF as invalid and proceeds to block 306 to set or maintain switching control SWC to an OFF level and signal a fault condition.

According to an embodiment, block 310 includes setting or maintaining controllable current source 258 in an OFF state and, thereby, generating or sinking zero discharge current. Block 312 includes measuring, in a first instance, voltages on the storage cells of backup battery 106. In some embodiments, the measurements may be designated V1C1, V1C2, . . . , and V1Cn, where n is the number of cells, C1-Cn indicates the specific cell, and V1 indicates voltages measured in the first instance or measuring. Following the first series of voltage measurements on the cells of backup battery 106, block 314 includes setting controllable current source 258 in an ON state and, thereby, generating or sinking discharge current IDIS.

In an embodiment, block 316 includes measuring, in a second instance, voltages on the storage cells of backup battery 106. In some embodiments, the measurements may be designated V2C1, V2C2, . . . , and V2Cn, where n again is the number of cells, C1-Cn indicates the specific cell, and V2 indicates voltages measured in the second instance or measuring. After block 316, block 318 includes waiting a delay time $t_{delay}$. In specific embodiments, delay time $t_{delay}$ may be set to between about 1 ms and about 1000 ms. In further embodiments, delay time $t_{delay}$ may be set by dividing the desired battery capacity by discharge current IDIS. For example, if the battery capacity is 12 µAh (0.012 mAh), corresponding to 12 squibs using 1 µAh each, and current source 258 has discharge current IDIS equal to 100 mA, then delay time $t_{delay}$ may be set equal to 0.012 mAh÷ 100 mA, which equals 0.00012 hours, or 432 ms. In other embodiments, delay time $t_{delay}$ may be any value. After waiting delay time $t_{delay}$, block 320 includes setting controllable current source 258 back in the OFF state and again generating or sinking zero discharge current.

According to an embodiment, block 322 includes measuring, in a third instance, voltages on the storage cells of backup battery 106. In some embodiments, the measurements may be designated V3C1, V3C2, . . . , and V3Cn, where n again is the number of cells, C1-Cn indicates the specific cell, and V3 indicates voltages measured in the third instance or measuring.

Following the third series of measurements in block 322, block 324 includes checking that the capacity of backup battery 106 meets a minimum capacity for activating a safety device, such as firing a squib or multiple squibs in some embodiments. In a specific embodiment, a minimum energy storage for backup battery 106 may be 1 microampere hour (µAh) per squib. This minimum energy storage, for example, is based on a maximum firing current for a squib of 1.52 A for a duration of 2.1 ms, leading to roughly 1 µAh being required to fire a squib. Thus, in a specific embodiment using 12 squibs to fire an airbag or set of airbags, backup battery 106 requires 12 µAh as a minimum capacity. In other embodiments, different safety devices or different squib requirements determine a different minimum capacity for backup battery 106 and BIST method 300 may be modified accordingly. Thus, according to an embodiment, block 324 may check that backup battery 106 is able to supply discharge current IDIS for the full duration of delay time $t_{delay}$ and may also check that the voltages V3C1 . . . V3Cn are each above a minimum voltage indicating that backup battery 106 has maintained the minimum capacity. If it is determined in block 324 that backup battery 106 does not have the minimum capacity for activating the safety device or devices, block 326 follows and includes signaling a capacity fault to a system error manager and the user, such as through error notification unit 260 in FIG. 3. For example, block 326 may include a warning light in an instrument panel of an automobile for notifying the operator that the airbag system has an error.

In an embodiment, if it is determined in block 324 that backup battery 106 does have the minimum capacity for activating the safety device or devices, block 328 follows and includes checking that internal resistance RINT of backup battery 106 meets a required internal firing resistance RFIRE for activating the safety device. In a specific example, as discussed above, each squib may require a current of 1.52 A to activate or fire. In order to improve the safety margin, the minimum firing current may be set to 2 A/squib in some embodiments. Thus, a 12 squib system may require a current of 24 A. Accordingly, the maximum value for internal firing resistance RFIRE may be set between 0.1Ω and 0.5Ω in specific embodiments in order to supply the minimum firing current. In other embodiments, internal firing resistance RFIRE may be set outside this range, depending on the safety device or devices used and the voltage and current required to activate the specific type of safety device.

In some embodiments, block 328 includes determining internal resistance RINT_k of each cell of backup battery 106 according to the formula RINT_k=(V1Ck−V2Ck)÷IDIS, where k is used to indicate a specific battery cell C1-Cn. In such embodiments, block 328 also includes checking that each internal resistance RINT_k is less than or equal to the maximum internal firing resistance RFIRE. If the internal resistance of each cell of backup battery 106 is below internal firing resistance RFIRE, block 332 follows and indicates that backup battery 106 passes the BIST and is operating correctly. If, on the other hand, the internal resistance of each cell of backup battery 106 is not below internal firing resistance RFIRE, block 330 follows and indicates that backup battery 106 is not able to activate the safety device in the event of an emergency. Accordingly, block 330 includes signaling an internal resistance fault to the system error manager and the user, which may include error notification unit 260 and activating a warning light in an instrument panel, as similarly described in reference to block 326.

In various embodiments, blocks 302-332 of BIST method 300 may include additional steps or blocks and may also be rearranged according to various other sequences.

Figure 5:
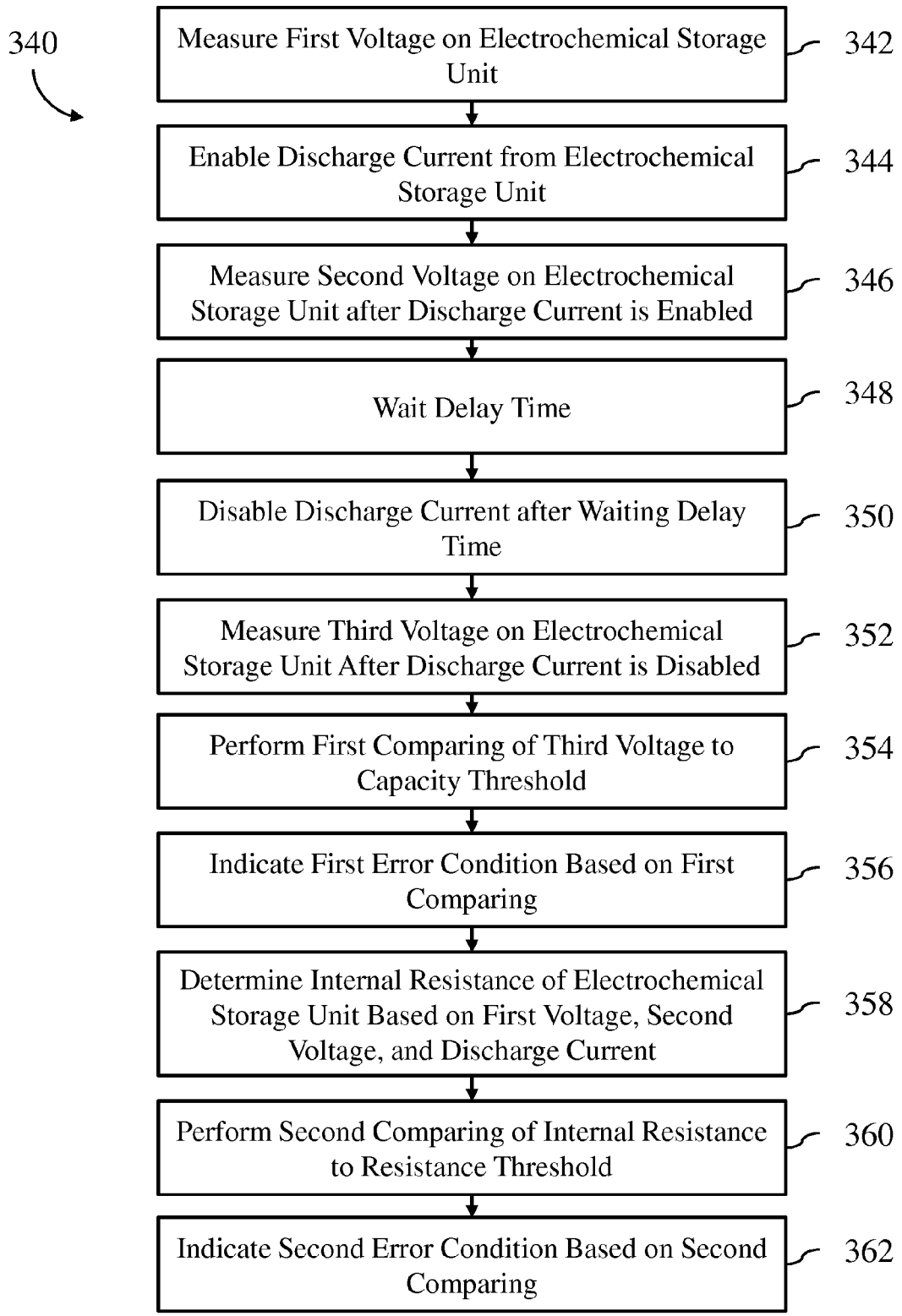
FIG. 5 illustrates a block diagram of an embodiment method of operation.

FIG. 5 illustrates a block diagram of an embodiment method of operation 340 including steps 342-362. According to various embodiments, method of operation 340 may be an implementation of a further embodiment BIST method for testing an electrochemical storage unit, such as a backup battery, coupled to an emergency safety device, such as a squib or squibs for an airbag. In an embodiment, step 342 includes measuring a first voltage on the electrochemical storage unit. Step 344 includes enabling a discharge current from the electrochemical storage unit. After enabling the discharge current, step 346 includes measuring a second voltage on the electrochemical storage unit. Step 348 includes waiting a delay time $t_{delay}$. After delay time $t_{delay}$, step 350 includes disabling the discharge current.

According to an embodiment, step 352 includes measuring a third voltage on the battery after the discharge current is disabled. Next, step 354 includes performing a first comparing of the third voltage to a capacity threshold. Step 356 includes indicating a first error condition based on the first comparing. Following steps 354 and 356, step 358 includes determining an internal resistance of the battery based on the first voltage, the second voltage, and the discharge current and step 360 includes performing a second comparing of the internal resistance to a resistance threshold. Finally, step 362 includes indicating a second error condition based on the second comparing. In some embodiments, the battery may be any type of electrochemical storage unit. In various embodiments, additional steps may be included and the steps may be further arranged according to other sequences in some alternative embodiments.

Figure 6:
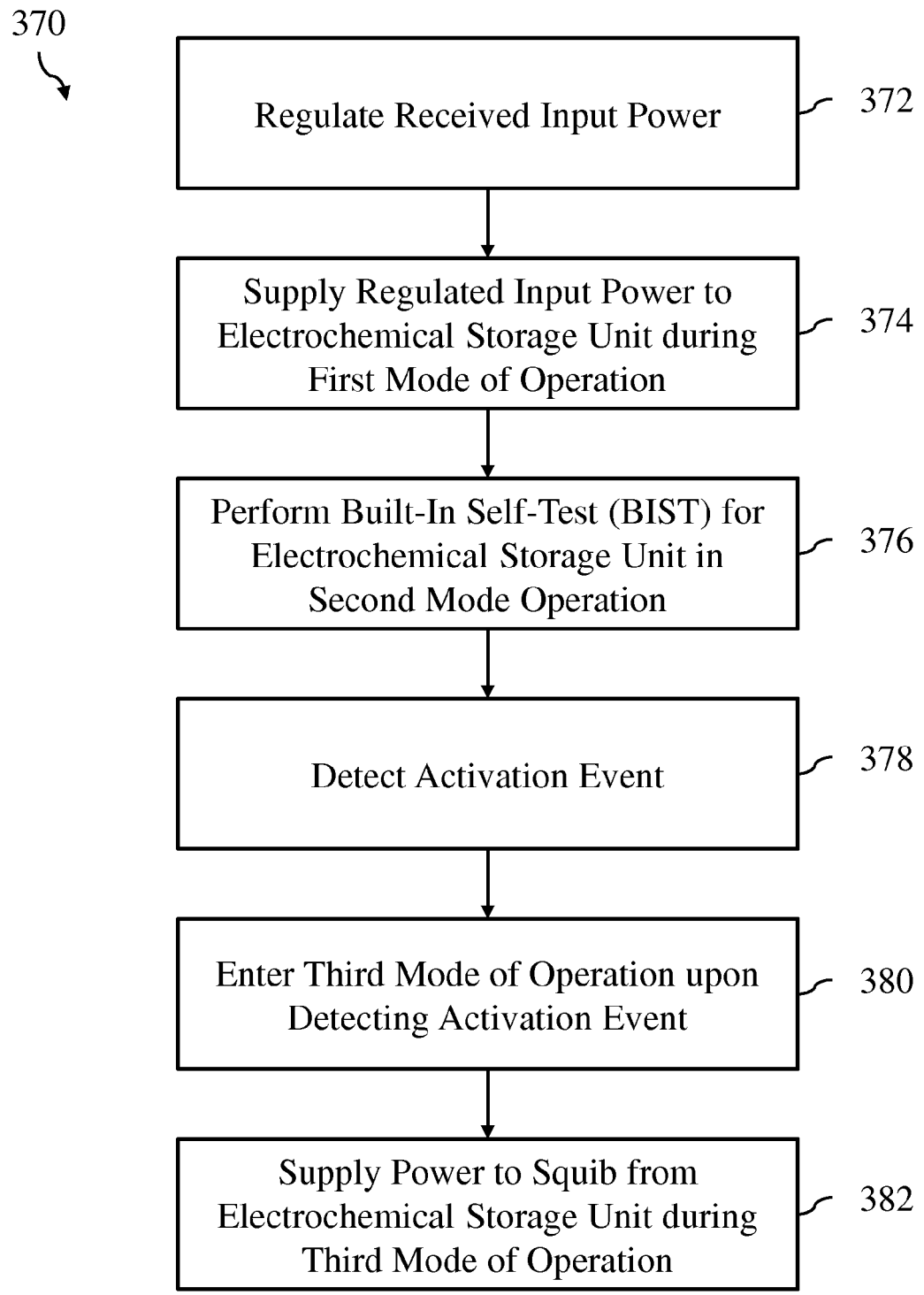
FIG. 6 illustrates a block diagram of another embodiment method of operation.

FIG. 6 illustrates a block diagram of another embodiment method of operation 370 including steps 372-382. According to an embodiment, method of operation 370 is a method of operating an airbag system. Step 372 includes regulating a received input power. Step 374 includes supplying the regulated input power to an electrochemical storage unit during a first mode of operation. Step 376 includes performing a built-in self-test (BIST) for the electrochemical storage unit in a second mode operation.

In an embodiment, step 378 includes detecting an activation event. Step 380 includes entering a third mode of operation upon detecting the activation event. Finally, step 382 includes supplying power to a squib from the electrochemical storage unit during the third mode of operation. In such an embodiment, the squib is configured to inflate the airbag when the squib is supplied from the electrochemical storage unit. According to further embodiments, multiple squibs may be supplied. In an alternative embodiment, safety devices other than airbags and squibs may be used and supplied. Steps 372-382 in method 370 may be arranged in a different sequence and may also include additional steps in alternative embodiments.

According to an embodiment, a backup and supply safety system includes a switching regulator and an electrochemical storage test circuit. The switching regulator is coupled to a power supply input and configured to supply a regulated voltage to a regulated supply terminal that is configured to be coupled to a safety device. The electrochemical storage test circuit is configured to be coupled to an electrochemical storage unit. The electrochemical storage test circuit includes a bidirectional switch with a first switch terminal coupled to the regulated supply terminal, a second switch terminal configured to be coupled to the electrochemical storage unit, and a switch control terminal. The electrochemical storage test circuit also includes a built-in self-test (BIST) circuit configured to be coupled to the electrochemical storage unit and to the switch control terminal.

In various embodiments, the backup and supply safety system further includes the electrochemical storage unit. The electrochemical storage unit may be a battery. In such embodiments, the battery may include a plurality of storage cells. In some embodiments, the BIST circuit includes a multiplexer with a plurality inputs and an output, an analog-to-digital converter (ADC) coupled to the output of the multiplexer, a controllable current source coupled to the battery through the bidirectional switch, and a logic control circuit coupled to the bidirectional switch, the controllable current source, the multiplexer, and the ADC. In such embodiments, each storage cell of the battery is coupled to an input of the multiplexer. In some embodiments, the battery is a lithium iron phosphate battery or a lithium titanate battery.

In various embodiments, the safety device is a squib configured to inflate an airbag. In some embodiments, the safety system is wholly contained within an airbag safety module. The switching regulator may be a full-bridge buck-boost switching regulator. In an embodiment, the bidirectional switch includes a first field effect transistor (FET) with a source, a drain coupled to the first switch terminal, and a gate coupled to the switch control terminal, and a second field effect transistor (FET) with a source coupled to the source of the first FET, a drain coupled to the second switch terminal, and a gate coupled to the switch control terminal.

In various embodiments, the bidirectional switch is configured to supply power from the switching regulator to the electrochemical storage unit during a first mode and to supply power from the electrochemical storage unit to the safety device in a second mode. The first mode includes operation of the safety system before detection of an event and the second mode includes operation of the safety system after detection of the event. The safety system may further include a microcontroller coupled to the regulated supply terminal and configured to be coupled to the safety device. The microcontroller controls the bidirectional switch to operate in the first mode or the second mode. In an embodiment, the safety system further includes an accelerometer coupled to the microcontroller and a pressure sensor coupled to the microcontroller. In such an embodiment, the microcontroller is configured to detect the event based on inputs received from the accelerometer and the pressure sensor. In an embodiment, the safety system further includes a buck converter coupled between the regulated supply terminal and the microcontroller.

In various embodiments, the BIST circuit is configured to measure a first voltage on the electrochemical storage unit, enable a discharge current from the electrochemical storage unit, measure a second voltage on the electrochemical storage unit after the discharge current is enabled, wait a delay time, disable the discharge current after waiting the delay time, measure a third voltage on the electrochemical storage unit after the discharge current is disabled, perform a first comparing of the third voltage to a capacity threshold, indicate a first error condition based on the first comparing, determine an internal resistance of the electrochemical storage unit based on the first voltage, the second voltage, and the discharge current, perform a second comparing of the internal resistance to a resistance threshold, and indicate a second error condition based on the second comparing.

According to an embodiment, a method of operating a safety system includes regulating a received input power, supplying the regulated input power to an electrochemical storage unit during a first mode of operation, performing a built-in self-test (BIST) for the electrochemical storage unit in a second mode of operation, detecting an activation event, entering a third mode of operation upon detecting the activation event, and supplying power to a safety device from the electrochemical storage unit during the third mode of operation.

In various embodiments, the safety device includes a squib configured to inflate an airbag when the squib is supplied from the electrochemical storage unit. The electrochemical storage unit includes a lithium iron phosphate battery or a lithium titanate battery. In some embodiments, performing a BIST includes measuring a first voltage on the electrochemical storage unit, enabling a discharge current from the electrochemical storage unit, measuring a second voltage on the electrochemical storage unit after the discharge current is enabled, waiting a delay time, disabling the discharge current after waiting the delay time, measuring a third voltage on the electrochemical storage unit after the discharge current is disabled, performing a first comparing of the third voltage to a capacity threshold, indicating a first error condition based on the first comparing, determining an internal resistance of the electrochemical storage unit based on the first voltage, the second voltage, and the discharge current, performing a second comparing of the internal resistance to a resistance threshold, and indicating a second error condition based on the second comparing.

According to an embodiment, a method of testing a battery configured to be coupled to a squib for an airbag includes measuring a first voltage on the battery, enabling a discharge current from the battery, measuring a second voltage on the battery after the discharge current is enabled, waiting a delay time, disabling the discharge current after waiting the delay time, measuring a third voltage on the battery after the discharge current is disabled, performing a first comparing of the third voltage to a capacity threshold, indicating a first error condition based on the first comparing, determining an internal resistance of the battery based on the first voltage, the second voltage, and the discharge current, performing a second comparing of the internal resistance to a resistance threshold, and indicating a second error condition based on the second comparing.

In various embodiments, the battery includes a plurality of storage cells and the method is performed for each cell of the plurality of cells. The storage cell of the plurality of storage cells comprises a lithium iron phosphate storage cell or a lithium titanate storage cell.

According to an embodiment, a test circuit includes a controllable current source, a switch coupled to the controllable current source, a battery coupled to the switch, a plurality of voltage measurement circuits, a multiplexer coupled to the plurality of measurement circuits, an analog-to-digital converter (ADC) coupled to an output of the multiplexer, and a control circuit coupled to an output of the ADC and comprising a plurality of control connections. The battery includes a plurality of energy storage cells and each energy storage cell has a first terminal and a second terminal. Further, each voltage measurement circuit is coupled to the first terminal and the second terminal of an energy storage cell of the plurality of energy storage cells. The plurality of control connections are coupled to the controllable current source, the switch, the multiplexer, and the ADC.

In various embodiments, the test circuit further includes an error notification unit coupled to the control circuit and configured to notify a user operating a machine coupled to the battery. The battery may be a lithium iron phosphate battery or a lithium titanate battery.

Advantages of various embodiments described herein may include replacing a high voltage capacitor as a backup supply for an emergency system with a long lifetime battery. The removal of the high voltage capacitor may decrease cost in the energy storage unit and may also allow system reorganization with lower voltage components being enabled by the long lifetime backup battery that provides a higher capacity at a lower voltage as compared to a capacitor. Further advantages may include reduced power dissipation of the system along with reduced heat generation because of the reduced power dissipation. In some specific embodiments, a boost converter may be eliminated from specific safety systems due to system redesign, resulting in reduced system costs.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A backup and supply safety system, the safety system comprising:
   a switching regulator coupled to a power supply input and configured to supply a regulated voltage to a regulated supply terminal, the regulated supply terminal configured to be coupled to a safety device; and
   an electrochemical storage test circuit configured to be coupled to an electrochemical storage unit, the electrochemical storage test circuit comprising:
      a bidirectional switch comprising a first switch terminal coupled to the regulated supply terminal, a second switch terminal configured to be coupled to the electrochemical storage unit, and a switch control terminal, and
      a built-in self-test (BIST) circuit configured to be coupled to the electrochemical storage unit and to the switch control terminal.

2. The safety system of claim 1, further comprising the electrochemical storage unit.

3. The safety system of claim 2, wherein the electrochemical storage unit comprises a battery.

4. The safety system of claim 3, wherein the battery comprises a plurality of storage cells.

5. The safety system of claim 4, wherein the BIST circuit comprises:
   a multiplexer comprising a plurality inputs and an output, wherein each storage cell of the battery is coupled to an input;
   an analog-to-digital converter (ADC) coupled to the output of the multiplexer;
   a controllable current source coupled to the battery through the bidirectional switch; and
   a logic control circuit coupled to the bidirectional switch, the controllable current source, the multiplexer, and the ADC.

6. The safety system of claim 3, wherein the battery comprises a lithium iron phosphate battery or a lithium titanate battery.

7. The safety system of claim 1, wherein the safety device comprises a squib configured to inflate an airbag.

8. The safety system of claim 7, wherein the safety system is wholly contained within an airbag safety module.

9. The safety system of claim 1, wherein the switching regulator comprises a full-bridge buck-boost switching regulator.

10. The safety system of claim 1, wherein the bidirectional switch comprises:
    a first field effect transistor (FET) having a source, a drain coupled to the first switch terminal, and a gate coupled to the switch control terminal; and
    a second field effect transistor (FET) having a source coupled to the source of the first FET, a drain coupled to the second switch terminal, and a gate coupled to the switch control terminal.

11. The safety system of claim 1, wherein the bidirectional switch is configured to supply power from the switching regulator to the electrochemical storage unit during a first mode and to supply power from the electrochemical storage unit to the safety device in a second mode, wherein
    the first mode comprises operation of the safety system before detection of an event, and
    the second mode comprises operation of the safety system after detection of the event.

12. The safety system of claim 11, further comprising a microcontroller coupled to the regulated supply terminal and configured to be coupled to the safety device, wherein the microcontroller controls the bidirectional switch to operate in the first mode or the second mode.

13. The safety system of claim 12, further comprising:
    an accelerometer coupled to the microcontroller; and
    a pressure sensor coupled to the microcontroller, wherein the microcontroller is configured to detect the event based on input from the accelerometer and from the pressure sensor.

14. The safety system of claim 12, further comprising a buck converter coupled between the regulated supply terminal and the microcontroller.

15. The safety system of claim 1, wherein the BIST circuit is configured to:
    measure a first voltage on the electrochemical storage unit;
    enable a discharge current from the electrochemical storage unit;

measure a second voltage on the electrochemical storage unit after the discharge current is enabled;

wait a delay time;

disable the discharge current after waiting the delay time;

measure a third voltage on the electrochemical storage unit after the discharge current is disabled;

perform a first comparing of the third voltage to a capacity threshold;

indicate a first error condition based on the first comparing;

determine an internal resistance of the electrochemical storage unit based on the first voltage, the second voltage, and the discharge current;

perform a second comparing of the internal resistance to a resistance threshold; and indicate a second error condition based on the second comparing.

16. A method of operating a safety system, the method comprising:

regulating a received input power;

supplying the regulated input power to an electrochemical storage unit during a first mode of operation;

performing a built-in self-test (BIST) for the electrochemical storage unit in a second mode of operation;

detecting an activation event;

entering a third mode of operation upon detecting the activation event; and supplying power to a safety device from the electrochemical storage unit during the third mode of operation.

17. The method of claim 16, wherein the safety device comprises a squib configured to inflate an airbag when the squib is supplied from the electrochemical storage unit.

18. The method of claim 16, wherein the electrochemical storage unit comprises a lithium iron phosphate battery or a lithium titanate battery.

19. The method of claim 16, wherein performing a BIST comprises:

measuring a first voltage on the electrochemical storage unit;

enabling a discharge current from the electrochemical storage unit;

measuring a second voltage on the electrochemical storage unit after the discharge current is enabled;

waiting a delay time;

disabling the discharge current after waiting the delay time;

measuring a third voltage on the electrochemical storage unit after the discharge current is disabled;

performing a first comparing of the third voltage to a capacity threshold;

indicating a first error condition based on the first comparing;

determining an internal resistance of the electrochemical storage unit based on the first voltage, the second voltage, and the discharge current;

performing a second comparing of the internal resistance to a resistance threshold; and indicating a second error condition based on the second comparing.

20. A method of testing a battery, the method comprising:

measuring a first voltage on the battery;

enabling a discharge current from the battery;

measuring a second voltage on the battery after the discharge current is enabled;

waiting a delay time;

disabling the discharge current after waiting the delay time;

measuring a third voltage on the battery after the discharge current is disabled;

performing a first comparing of the third voltage to a capacity threshold;

indicating a first error condition based on the first comparing;

determining an internal resistance of the battery based on the first voltage, the second voltage, and the discharge current;

performing a second comparing of the internal resistance to a resistance threshold; and indicating a second error condition based on the second comparing.

21. The method of claim 20, wherein the battery comprises a plurality of storage cells and the method is performed for each cell of the plurality of storage cells.

22. The method of claim 21, wherein storage cell of the plurality of storage cells comprises a lithium iron phosphate storage cell or a lithium titanate storage cell.

23. A test circuit comprising:

a controllable current source;

a switch coupled to the controllable current source;

a plurality of voltage measurement circuits, each voltage measurement circuit configured to be coupled to a first terminal and a second terminal of an energy storage cell of a plurality of energy storage cells;

a multiplexer coupled to the plurality of voltage measurement circuits;

an analog-to-digital converter (ADC) coupled to an output of the multiplexer; and a control circuit coupled to an output of the ADC and comprising a plurality of control connections, wherein the plurality of control connections are coupled to the controllable current source, the switch, the multiplexer, and the ADC.

24. The test circuit of claim 23, further comprising an error notification unit coupled to the control circuit and configured to notify a user of a battery error condition based on measurements by the plurality of voltage measurement circuits.

25. The test circuit of claim 23, further comprising a battery coupled to the switch, the battery comprising the plurality of energy storage cells.

26. The test circuit of claim 25, wherein the battery comprises a lithium iron phosphate battery or a lithium titanate battery.

* * * * *